US012658794B2

(12) United States Patent　　　　(10) Patent No.:　　US 12,658,794 B2
Banerjee et al.　　　　　　　　　(45) Date of Patent:　　Jun. 16, 2026

(54) METHODS AND APPARATUS TO GENERATE AND COMPENSATE AN OUTPUT VOLTAGE OF REGULATOR CIRCUITRY

(71) Applicant: Texas Instruments Incorporated, Dallas, TX (US)

(72) Inventors: Vikram Banerjee, Tucson, AZ (US); Biraja Dash, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 198 days.

(21) Appl. No.: 18/428,953

(22) Filed: Jan. 31, 2024

(65) Prior Publication Data

US 2025/0202352 A1　　Jun. 19, 2025

Related U.S. Application Data

(60) Provisional application No. 63/611,963, filed on Dec. 19, 2023.

(51) Int. Cl.
　　*G05F 1/567*　　(2006.01)
　　*H02M 3/155*　　(2006.01)
　　*H03F 3/45*　　(2006.01)
　　*H03K 17/14*　　(2006.01)

(52) U.S. Cl.
　　CPC ............ *H02M 3/155* (2013.01); *H03K 17/14* (2013.01)

(58) Field of Classification Search
　　CPC ...... G05F 1/567; H03F 3/45273; H03F 3/345; H03K 17/14
　　See application file for complete search history.

(56) References Cited

U.S. PATENT DOCUMENTS

| | | | | |
|---|---|---|---|---|
| 4,550,284 | A | 10/1985 | Sooch | |
| 11,429,128 | B2 * | 8/2022 | Matej | G05F 1/468 |
| 12,362,712 | B2 * | 7/2025 | Varier | H03F 3/21 |
| 2013/0328542 | A1 * | 12/2013 | Wang | G05F 3/245 |
| | | | | 323/313 |
| 2017/0108883 | A1 * | 4/2017 | Hu | G05F 1/575 |
| 2018/0173259 | A1 * | 6/2018 | Mæland | G05F 1/575 |
| 2024/0077899 | A1 * | 3/2024 | Chitnis | G05F 1/463 |
| 2024/0288890 | A1 * | 8/2024 | Sankaranarayanan | |
| | | | | G05F 1/575 |

(Continued)

OTHER PUBLICATIONS

Filanovsky et al., "Sub-Regulators for Biasing Circuits," 2012 IEEE 55th International Midwest Symposium on Circuits and Systems (MWSCAS), 2012, pp. 314-317, Boise, ID, USA, 4 pages.

(Continued)

*Primary Examiner* — Sisay G Tiku
(74) *Attorney, Agent, or Firm* — Xianghui Huang; Frank D. Cimino

(57)　　　　ABSTRACT

An example apparatus includes: pass gate circuitry having a first terminal and a second terminal; process tracker circuitry having a first terminal and a second terminal, the first terminal of the process tracker circuitry coupled to the first terminal of the pass gate circuitry; and temperature compensation circuitry having a first terminal and a second terminal, the first terminal of the temperature compensation circuitry coupled to the second terminal of the process tracker circuitry, and the second terminal of the temperature compensation circuitry coupled to the second terminal of the pass gate circuitry.

20 Claims, 7 Drawing Sheets

(56) References Cited

U.S. PATENT DOCUMENTS

| | | | | |
|---|---|---|---|---|
| 2024/0329101 A1* | 10/2024 | Maitra | ............. | G01R 19/16571 |
| 2025/0080047 A1* | 3/2025 | Pilankar | ............... | H03K 3/0231 |
| 2025/0237716 A1* | 7/2025 | Parkhurst | ........... | G01R 33/0082 |

OTHER PUBLICATIONS

Texas Instruments., "Voltage Regulator Circuit," Specification of USPTO application, 25 pages.

Texas Instruments., "Figures" Figures of USPTO Application, 4 pages.

Chitnis et al., "Nano-ampere, Minimum Supply Tracking Sub-regulator Circuit," April, 1, 2020, 16 pages.

Vadim Ivanov, Analog Techniques for Nano-power Circuits, ISSCC 2015 Tutorial.

* cited by examiner

METHODS AND APPARATUS TO GENERATE AND COMPENSATE AN OUTPUT VOLTAGE OF REGULATOR CIRCUITRY

CROSS-REFERENCE TO RELATED APPLICATION

This patent application claims the benefit of and priority to U.S. Provisional Patent Application Ser. No. 63/611,963 filed Dec. 19, 2023, which is hereby incorporated herein by reference in its entirety.

TECHNICAL FIELD

This description relates generally to regulator circuitry and, more particularly, to methods and apparatus to generate and compensate an output voltage of regulator circuitry.

BACKGROUND

Continuing advancements in electronics allow circuitry to perform increasingly complex operations, while consuming less overall power. As electronics continue to advance, designers are incentivized to develop voltage regulator circuitry that can reliably operating across a wide range of operating conditions. For example, voltage regulator circuitry is considered reliable when an output voltage is stable at relatively low temperatures and relatively high temperatures.

SUMMARY

For methods and apparatus to generate and compensate an output voltage of regulator circuitry, an example apparatus includes pass gate circuitry having a first terminal and a second terminal; process tracker circuitry having a first terminal and a second terminal, the first terminal of the process tracker circuitry coupled to the first terminal of the pass gate circuitry; and temperature compensation circuitry having a first terminal and a second terminal, the first terminal of the temperature compensation circuitry coupled to the second terminal of the process tracker circuitry, and the second terminal of the temperature compensation circuitry coupled to the second terminal of the pass gate circuitry. Other examples are described.

For methods and apparatus to generate and compensate an output voltage of regulator circuitry, an example apparatus includes process tracker circuitry having a terminal; and temperature compensation circuitry including: a first transistor having a first terminal and a control terminal; a second transistor having a first terminal, a second terminal, and a control terminal, the first terminal of the second transistor coupled to the first terminal of the first transistor; a third transistor having a first terminal, a second terminal, and a control terminal, the first terminal of the third transistor is coupled to the control terminal of the first transistor and the second terminal of the second transistor; a fourth transistor having a first terminal, a second terminal, and a control terminal, the first terminal of the fourth transistor coupled to the control terminal of the third transistor and the control terminal of the third transistor; and a fifth transistor having a first terminal and a control terminal, the first terminal of the fifth transistor coupled to the terminal of the process tracker circuitry, the control terminal of the fifth transistor coupled to the control terminal of the second transistor, the second terminal of the third transistor, and the second terminal of the fourth transistor. Other examples are described.

For methods and apparatus to generate and compensate an output voltage of regulator circuitry, an example apparatus includes pass gate circuitry configured to source a first current from a supply; process tracker circuitry coupled to the pass gate circuitry, the process tracker circuitry configured to: generate an output voltage responsive to the first current, the output voltage having a negative temperature dependency; and generate a feedback current responsive to generating the output voltage; and temperature compensation circuitry coupled to the process tracker circuitry and the pass gate circuitry, the temperature compensation circuitry configured to: generate an offset voltage having a positive temperature dependency; and compensate the output voltage with the offset voltage. Other examples are described.

BRIEF DESCRIPTION OF THE DRAWINGS

The same reference numbers or other reference designators are used in the drawings to designate the same or similar (functionally and/or structurally) features.

DETAILED DESCRIPTION

Figure 1:
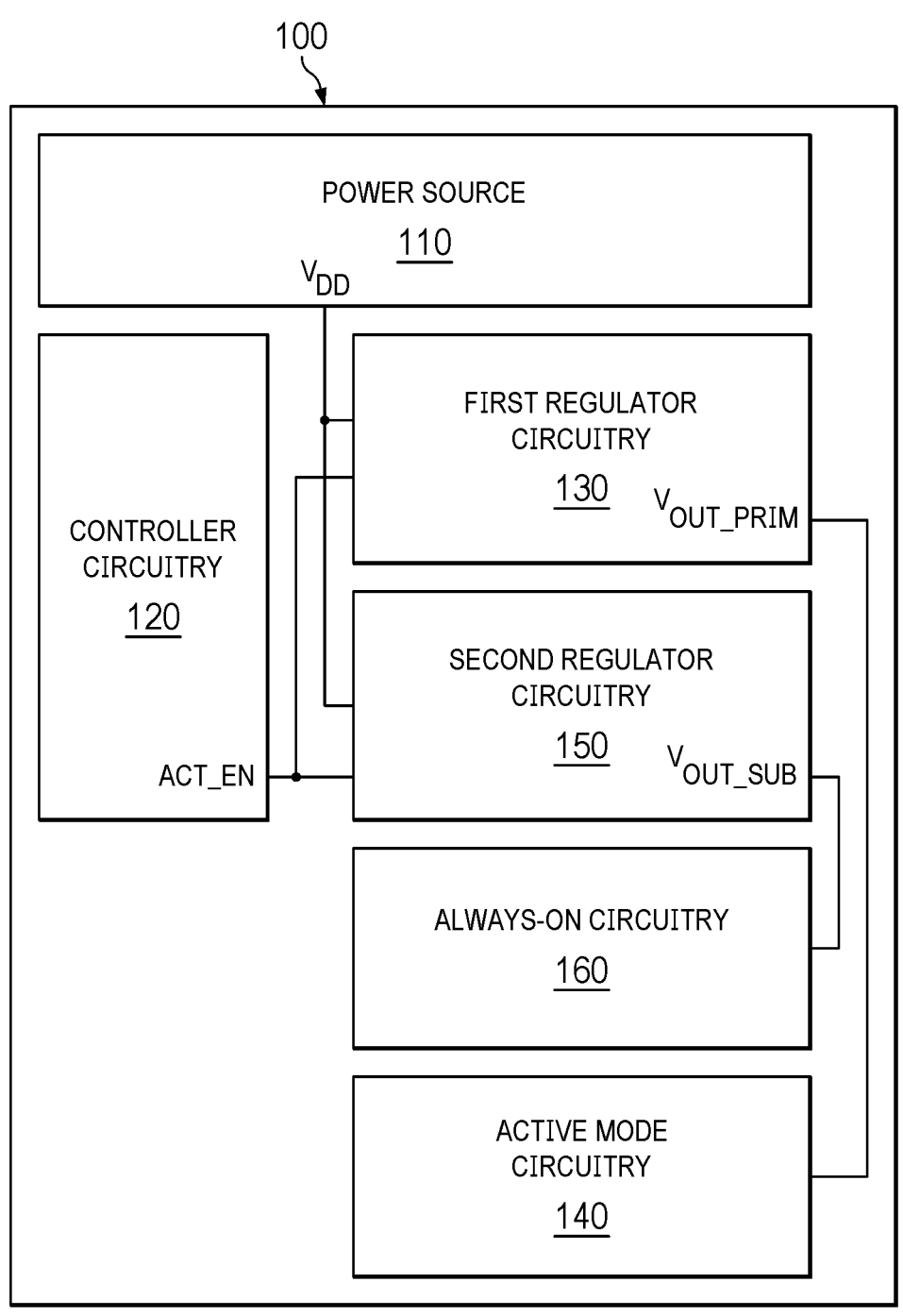
FIG. 1 is a block diagram of an example device including example regulator circuitry that regulates a supply voltage to supply power to circuitry.

The drawings are not necessarily to scale. Generally, the same reference numbers in the drawing(s) and this description refer to the same or like parts. Although the drawings show regions with clean lines and boundaries, some or all of these lines and/or boundaries may be idealized. In reality, the boundaries and/or lines may be unobservable, blended and/or irregular.

Continuing advancements in electronics allow circuitry to perform increasingly complex operations, while consuming less overall power. As electronics continue to advance, designers are incentivized to develop voltage regulator circuitry that can reliably operate across a wide range of operating conditions. For example, voltage regulator circuitry is considered reliable when an output voltage is stable at relatively low temperatures and relatively high temperatures. Regulator circuitry generates an output voltage by regulating an input voltage. In some examples, such as battery-operated devices, the input voltage varies as the battery charges or discharges. In such examples, the regulator circuitry generates a stable output voltage despite variations in the input voltage. With the continuing advancements of electronics, regulator circuitry continues to become increasingly reliable and consume less energy.

Some regulator circuitry, which may be referred to as reference band gap regulator circuitry, includes a bandgap reference, error amplifier circuitry, pass gate circuitry, and a resistor ladder. The bandgap reference generates a reference voltage that the error amplifier circuitry uses as a reference. The error amplifier circuitry controls the pass gate circuitry by comparing the reference voltage of the bandgap reference to a stepped down output voltage from the resistor ladder. The pass gate circuitry controls the output voltage of the regulator circuitry by supplying an output current to external circuitry and the resistor ladder. The output voltage of such regulator circuitry is determined by the current being supplied by the pass gate circuitry and the resistance of the resistor ladder. The error amplifier circuitry regulates the current being supplied by the pass gate circuitry is proportional to the reference voltage. In such operations, the output voltage of the regulator circuitry is proportional to the reference voltage and the resistances of the resistor ladder.

In such examples, bipolar junction transistors of the bandgap reference increase the system-on-chip (SoC) size of the regulator circuitry. The error amplifier circuitry controls the pass gate circuitry to supply a fixed output voltage irrespective of process and temperature variations. Such control leads to variations in power consumption by circuitry being powered by the regulator circuitry. Process variations are non-ideal variations in component values from designed values responsive to component tolerances and manufacturing variations. Temperature variations are variations in component values from designed values responsive to variations in environmental conditions of the circuitry. Such regulator circuitry has a relatively high quiescent current (IQ) due to the bandgap reference, the error amplifier circuitry, and the resistor ladder. The quiescent current is a current consumed by the regulator circuitry to produce the output voltage (i.e., current not output from the regulator circuitry to a load). Such a relatively high quiescent current may limit the use of such regulator circuitry. For example, designers may use alternative regulator circuitry for battery powered systems.

Other regulator circuitry, which may be referred to as supply tracking regulator circuitry, includes bias current generation circuitry, process tracker circuitry, and pass gate circuitry. The bias current generation circuitry generates a bias current, which the process tracker circuitry uses to sub-regulate the pass gate circuitry. Such regulator circuitry is coupled as a feedback loop between the pass gate circuitry and the process tracker circuitry. The feedback loop controls the pass gate circuitry, which regulates the output voltage. The process tracker circuitry uses characteristics of circuit components to regulate the output voltage of the regulator circuitry.

In some examples, process tracker circuitry uses threshold voltages of one or more transistors to generate the output voltage. In such examples, the threshold voltages of the transistors have a relatively low process variation. However, the threshold voltage of transistors of the process tracker circuitry varies across with temperature. Gate-to-source voltages of transistors vary responsive to a complementary-to-absolute temperature (CTAT) bias. The CTAT bias characterizes a decrease in gate-to-source voltages of transistors as temperature increases. Such a CTAT bias may be referred to as a negative temperature dependency. Some circuitry, such as logic devices, which are coupled to regulator circuitry that has an output voltage with a negative temperature dependency may fail to operate properly responsive to decreases in the output voltage as temperatures increase. For example, logic devices struggle to satisfy timing needs responsive to temperature dependent variations in the regulator circuitry. Although using threshold voltages of transistors reduces process variations, the output voltage of the regulator circuitry still varies across temperatures.

Examples described herein include example methods and apparatus to generate and compensate an output voltage of regulator circuitry using temperature compensation circuitry. In some described examples, the regulator circuitry includes bias current generation circuitry, current mirror circuitry, pass gate circuitry, process tracker circuitry, and temperature compensation circuitry. The current mirror circuitry, the pass gate circuitry, the process tracker circuitry, and the temperature compensation circuitry are coupled to form a feedback loop, which controls the pass gate circuitry. The process tracker circuitry includes a plurality of transistors that generate the output voltage responsive to the gate-to-source voltages of the plurality of transistors. However, the gate-to-source voltages of the process tracker circuitry decrease as the temperature of the circuitry increases, which has a negative temperature dependency. To compensate for such variations, the temperature compensation circuitry uses a plurality of transistors to generate an offset voltage that increases as the temperature of the circuitry increases.

In some described examples, the bias current generation circuitry generates a bias current that, when supplied, operates transistors of the temperature compensation circuitry in a sub-threshold mode of operation. In a sub-threshold mode of operation, the gate-to-source voltages of the transistors increase as temperature increases, which has a positive temperature dependency. In such sub-threshold mode of operation, the gate-to-source voltage of the transistor is generated by a threshold voltage, which decreases with increase in temperature, and a thermal voltage, which increases with temperature. In example operations, the thermal voltage contribution to the gate-to-source voltage is scaled by parameters of the transistors and the bias current. Advantageously, adjusting the bias current modifies the temperature dependency of the gate-to-source voltages by scaling the thermal voltage. The temperature compensation circuitry offsets the output voltage by compensating the decreases in the threshold voltages of the process tracker circuitry with an offset voltage that increases as temperature increases. Advantageously, the temperature compensation circuitry reduces variations in the output voltage of the regulator circuitry.

FIG. 1 is a block diagram of an example device 100. In the example of FIG. 1, the device 100 includes an example power source 110, example controller circuitry 120, first example regulator circuitry 130, example active mode circuitry 140, second example regulator circuitry 150, and example always-on circuitry 160. The device 100 sequences the supply of power to the circuitry 140, 160 to reduce an overall power consumption. For example, when the device 100 is a temperature measurement device, the device 100 sequences the power to the circuitry 140, 160 to reduce an overall power consumption. In some examples, the device 100 limits a supply of power to the active mode circuitry 140 using the regulator circuitry 130. In such examples, the device 100 operates the active mode circuitry 140 for relatively short durations of time. Advantageously, the device 100 decreases an average power consumption by using the regulator circuitry 130 to regulate a supply of power to the active mode circuitry 140 and the regulator circuitry 150 to always supply power to the always-on circuitry 160.

The power source 110 is coupled to the regulator circuitry 130, 150. The power source 110 supplies a supply voltage ($V_{DD}$) to the regulator circuitry 130, 150. In some examples, the power source 110 is an energy storage device, such as a battery. In such examples, the supply voltage decreases as the energy storage device discharges. In one example, when the power source 110 is fully charged, the supply voltage is approximately twelve and a half volts (V). However, when the power source 110 is almost fully discharged, the supply voltage is approximately equal to eleven and a half volts. In another example, when the power source 110 is fully charged, the supply voltage is approximately five and a half volts (V). However, when the power source 110 is almost fully discharged, the supply voltage is approximately equal to one and four-tenths volts. In such examples, the regulator circuitry 130, 150 regulates an output voltage at approximately one and three tenths' volts to account for variations in the supply voltage as the power source 110 discharges.

The controller circuitry 120 has an output coupled to the regulator circuitry 130, 150. The controller circuitry 120 controls a mode of operation of the device 100. The controller circuitry 120 generates an active mode indication (ACT_EN), which represents a mode of operation the device 100. In a first mode of operation, referred to as an active mode, the controller circuitry 120 activates the regulator circuitry 130, 150. In such an active mode of operation, the regulator circuitry 130 powers the active mode circuitry 140 responsive to the active mode indication from the controller circuitry 120. In a second mode of operation, referred to as a sleep mode or an inactive mode, the controller circuitry 120 deactivates the regulator circuitry 130 and activates the regulator circuitry 150. In such a mode of operation, the regulator circuitry 130 prevents the supply of power to the active mode circuitry 140 responsive to the active mode indication from the controller circuitry 120. In some examples, the controller circuitry 120 increases the output voltage from the regulator circuitry 150 responsive to the active mode indication indicating an active mode of operation. Such an increase in the output voltage, during the active mode, increases the bandwidth of the always-on circuitry 160 which increases the reliability of logic circuitry. Advantageously, the device 100 consumes less power when in the sleep mode of operation responsive to the active mode circuitry 140 being deactivated.

In example operations, the controller circuitry 120 periodically cycles between active and sleep modes of operation. In such example operations, the controller circuitry 120 separates a period into a first duration and a second duration. The first duration corresponds to the device 100 being in the active mode of operation and the second duration corresponds to the device 100 being in the sleep mode of operation. In some examples, the first duration is determined by a speed of the active mode circuitry 140, and the second duration is determined by a frequency in which the operations of the active mode circuitry 140 need to be performed. For example, when the device 100 is a temperature measurement device, the controller circuitry 120 sets the device 100 to an active mode of operation for a duration needed to determine a temperature. In such an example, the controller circuitry 120 sets the device 100 to a sleep mode of operation for a duration between temperature measurements. Advantageously, the controller circuitry 120 decreases the total power consumption of the device 100 by periodically switching between active and sleep modes of operation.

The regulator circuitry 130 has a first input coupled to the power source 110, a second input coupled to the controller circuitry 120, and an output coupled to the active mode circuitry 140. The regulator circuitry 130 receives the supply voltage from the power source 110 and the active mode indication from the controller circuitry 120. The controller circuitry 120 controls the regulator circuitry 130 using the active mode indication. The regulator circuitry 130 is activated responsive to the active mode indication representing an active mode of operation. When active, the regulator circuitry 130 regulates a supply of power from the power source 110 to supply an output voltage ($V_{OUT\_PRIM}$) to the active mode circuitry 140. The regulator circuitry 130 is deactivated responsive to the active mode indication representing a sleep mode of operation. When deactivated, the regulator circuitry 130 prevents the supply of power from the power source 110 to the active mode circuitry 140.

The active mode circuitry 140 has an input coupled to the regulator circuitry 130. The active mode circuitry 140 receives power from the regulator circuitry 130. The active mode circuitry 140 is circuitry that only needs to operate for a relatively short period of time. For example, temperature sensing circuitry that measures an ambient temperature every few minutes. The active mode circuitry 140 receives power from the regulator circuitry 130 responsive to the device 100 being in an active mode of operation. The active mode circuitry 140 has approximately zero power consumption when the device 100 is in the sleep mode of operation. Advantageously, the regulator circuitry 130 allows the active mode circuitry 140 to be deactivated during the sleep mode of operation, which decreases an overall power consumption of the device 100.

The regulator circuitry 150 has a first input coupled to the power source 110 and may have a second input coupled to the controller circuitry 120. The regulator circuitry 150 has an output coupled to the always-on circuitry 160. In some examples, the regulator circuitry 150 is referred to as sub-regulator circuitry. The regulator circuitry 150 receives the supply voltage from the power source 110 and may receive the active mode indication from the controller circuitry 120. The regulator circuitry 130 regulates a supply of power from the power source 110 to supply an output voltage ($V_{OUT\_SUB}$) to the always-on circuitry 160. In example operations, the regulator circuitry 150 supplies power to the always-on circuitry 160 despite the mode of operation of the device 100. In some examples, the regulator circuitry 150 supplies a first output current and voltage responsive to the device 100 being in the sleep mode and a second output current and voltage responsive to the device 100 being in the active mode. In such examples, the variation in the output current of the regulator circuitry 150 compensates for an increase in power consumption of the always-on circuitry 160 during the active mode of operation.

The always-on circuitry 160 has an input coupled to the regulator circuitry 150. The always-on circuitry 160 receives power from the regulator circuitry 150. For example, the always-on circuitry 160 is circuitry that always or substantially always operates, for instance digital logic that supports power on reset (POR) operations. In such examples, the output voltage of the regulator circuitry 150 supports the digital logic circuitry of the always-on circuitry 160 despite variations in the temperature of the device 100 and the supply voltage as the power source 110 discharges. Advantageously, the regulator circuitry 150 allows the always-on circuitry 160 to continue to operate despite the device 100 being in the sleep mode of operation.

Figure 2:
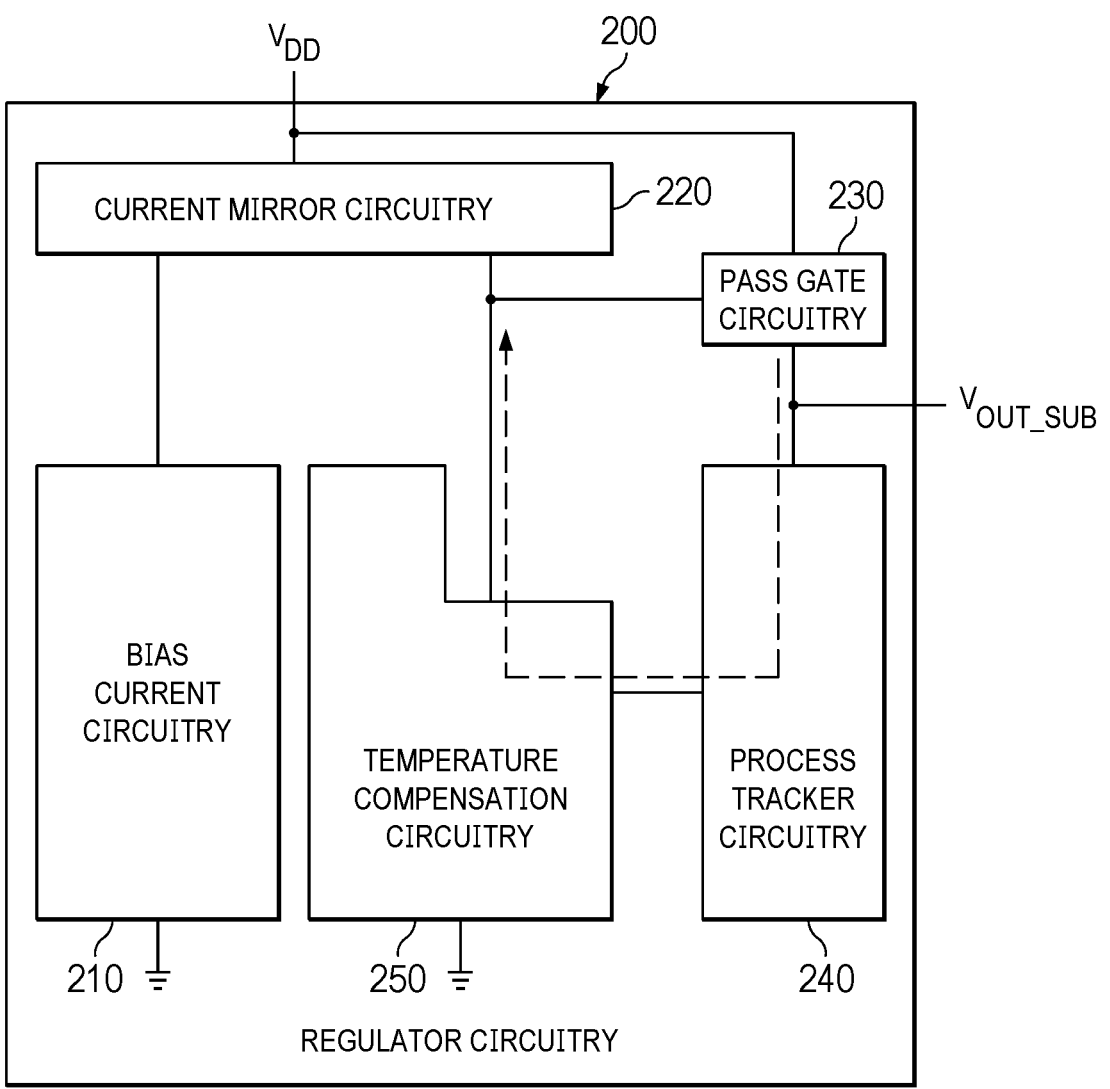
FIG. 2 is a block diagram of example regulator circuitry, which is an example of the regulator circuitry of FIG. 1, including circuitry to regulate an output voltage and track process variations responsive to a bias current.

FIG. 2 is a block diagram of example regulator circuitry 200, which is an example of the regulator circuitry 130, 150 of FIG. 1. In the example of FIG. 2, the regulator circuitry 200 includes example bias current circuitry 210, example current mirror circuitry 220, example pass gate circuitry 230, example process tracker circuitry 240, and example temperature compensation circuitry 250. The regulator circuitry 200 generates an output voltage ($V_{OUT\_SUB}$) that is approximately equal to an offset voltage from the temperature compensation circuitry 250 plus voltages of the process tracker circuitry 240. Advantageously, the offset voltage increases as the temperature increases to compensate for decreases in the voltages of the process tracker circuitry 240 as the temperature increases.

The bias current circuitry 210 has a first terminal coupled to the current mirror circuitry 220 and a second terminal coupled to a common terminal, which supplies a common potential (e.g., ground). The bias current circuitry 210 generates a bias current. In example operations, the bias current circuitry 210 generates a bias current having a magnitude that sets the temperature compensation circuitry 250 to sub-threshold operating conditions. Sub-threshold operating conditions occur when a transistor has a drain-to-source current despite the gate-to-source voltage being less than the threshold voltage of the transistor. In sub-threshold operating conditions, the transistor conducts a current resulting from non-ideal performance (e.g., leakage, a relatively weak inversion region, etc.). For example, ideally, a transistor prevents the flow of current when the gate-to-source voltage of the transistor is less than the threshold voltage, however, in practice the transistor continues to allow a relatively small amount of current to flow. In such an example, the magnitude of the current flowing through the transistor is proportional to the voltage at the gate of the transistor. In such a mode of operation, transistors have a proportional-to-absolute temperature (PTAT) bias current that increases in magnitude as temperature increases. The PTAT bias of the temperature compensation circuitry 250 characterizes an increase in the offset voltage as temperature increases. Such a PTAT bias may be referred to as a positive temperature dependency. The bias current circuitry 210 sources the bias current from the current mirror circuitry 220. An example implementation of the bias current circuitry 210 is illustrated and described in connection with FIGS. 3 and 4, below.

The current mirror circuitry 220 has a first terminal coupled to a supply terminal, which supplies a supply voltage ($V_{DD}$), a second terminal coupled to the bias current circuitry 210, a third terminal coupled to the pass gate circuitry 230 and the temperature compensation circuitry 250, and a fourth terminal coupled to the temperature compensation circuitry 250. The current mirror circuitry 220 allows the bias current circuitry 210 to source the bias current from the supply terminal. The current mirror circuitry 220 provides output currents responsive to the bias current. The current mirror circuitry 220 generates the output currents by mirroring the magnitude of the bias current. The current mirror circuitry 220 supplies a first output current to the temperature compensation circuitry 250 and a second output current to the pass gate circuitry 230 and the temperature compensation circuitry 250. An example implementation of the current mirror circuitry 220 is illustrated and described in connection with FIGS. 3 and 4, below.

The pass gate circuitry 230 has a first terminal coupled to the supply terminal, which supplies the supply voltage, a second terminal coupled to the current mirror circuitry 220 and the temperature compensation circuitry 250, and a third terminal coupled to the process tracker circuitry 240 and that may be coupled to external circuitry. The pass gate circuitry 230 supplies an output current to the process tracker circuitry 240 and the external circuitry by sourcing a current from the supply terminal. A feedback loop, which is structured by the pass gate circuitry 230, the process tracker circuitry 240, and the temperature compensation circuitry 250, controls the current supplied by the pass gate circuitry 230. In example operations, variations in the process tracker circuitry 240 and/or the temperature compensation circuitry 250 modify currents of the feedback loop, which adjusts the current supplied by the pass gate circuitry 230. In such example operations, adjusting the current supplied by the pass gate circuitry 230 compensates for the variations in the currents of the feedback loop. Advantageously, the pass gate circuitry 230 allows the process tracker circuitry 240 and the temperature compensation circuitry 250 to regulate currents and compensate the output voltage for variations. An example implementation of the pass gate circuitry 230 is illustrated and described in connection with FIG. 3, below.

Figure 3:
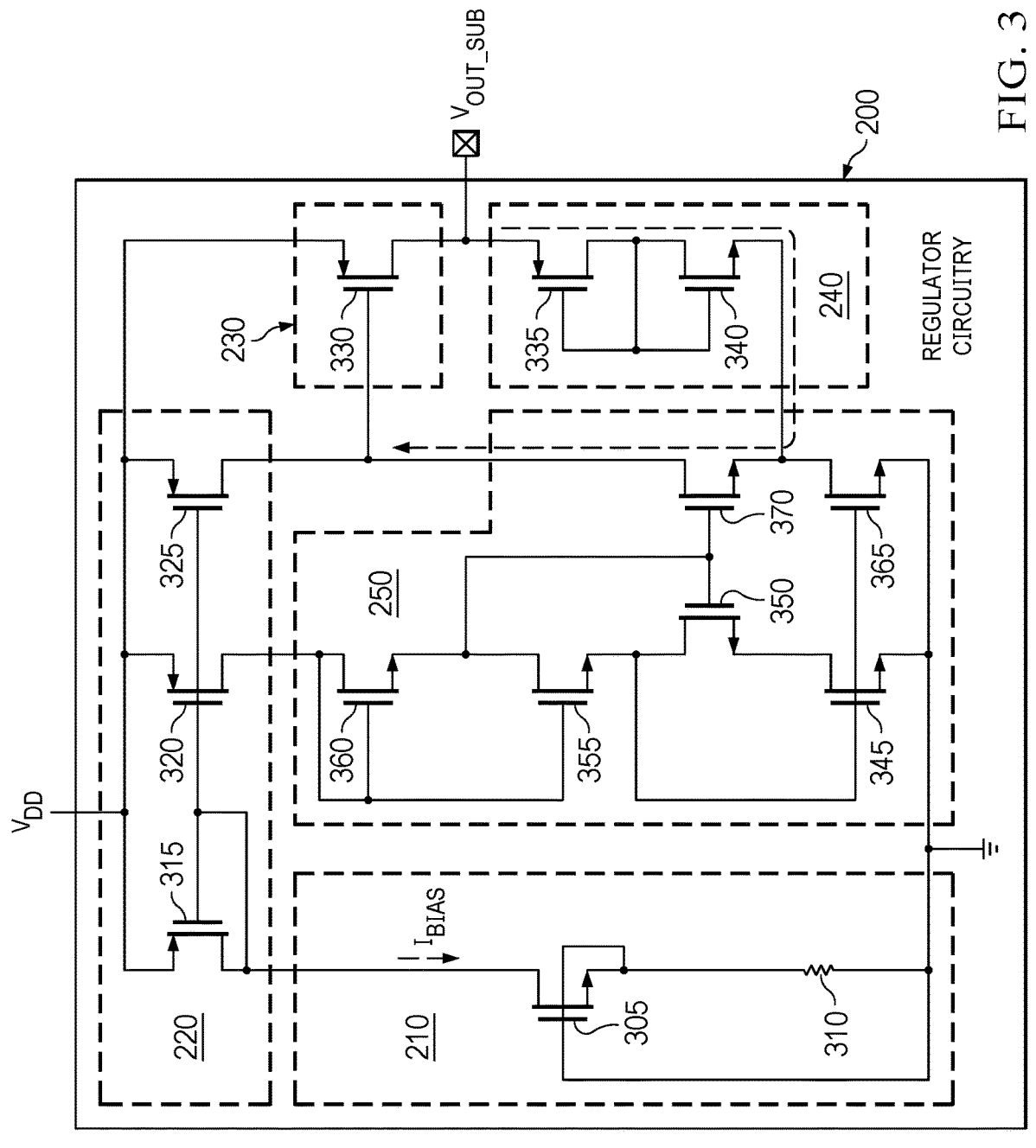
FIG. 3 is a schematic diagram of an example of the regulator circuitry of FIGS. 1 and 2, which generates an output voltage responsive to a bias current.

The process tracker circuitry 240 has a first terminal coupled to the pass gate circuitry 230 and that may be coupled to external circuitry and a second terminal coupled to the temperature compensation circuitry 250. The process tracker circuitry 240 receives current from the pass gate circuitry 230 and an offset voltage from the temperature compensation circuitry 250. The process tracker circuitry 240 generates the output voltage of the regulator circuitry 200 that is approximately equal to the offset voltage plus gate-to-source voltages of one or more transistors, which are illustrated in FIG. 3, below. The process tracker circuitry 240 generates the output voltage responsive to the circuitry coupled to the regulator circuitry 200. For example, when supplying power to digital circuitry, the process tracker circuitry 240 improves the energy-delay-product (EDP) of the digital circuitry despite process variations in components of the regulator circuitry 200.

Advantageously, the process tracker circuitry 240 generates the offset voltage that accounts for process variations of components. Advantageously, as further described below, the offset voltage has a PTAT bias that compensates a complementary-to-absolute temperature (CTAT) bias of the gate-to-source voltages of the process tracker circuitry 240. The CTAT bias of the process tracker circuitry 240 characterizes a decrease in the gate-to-source voltages of transistors as temperature increases. Such a CTAT bias may be referred to as a negative temperature dependency. An example implementation of the process tracker circuitry 240 is illustrated and described in connection with FIG. 3, below.

The temperature compensation circuitry 250 has a first terminal coupled to the current mirror circuitry 220, a second terminal coupled to the current mirror circuitry 220 and the pass gate circuitry 230, a third terminal coupled to the process tracker circuitry 240, and a fourth terminal coupled to the common terminal. The temperature compensation circuitry 250 receives the output current, which is proportional to the bias current, from the current mirror circuitry 220 and receives a feedback current from the process tracker circuitry 240. The feedback current is the current used by the process tracker circuitry 240 to generate the gate-to-source voltages. In some examples, the feedback current includes the bias current, which is a direct current (DC), and a variation current, which is an alternating current (AC). The variation current is proportional to current variations responsive to the process tracker circuitry 240 compensating the output voltage. Advantageously, such feedback current regulates the pass gate circuitry 230 to account for variations in the output voltage.

The temperature compensation circuitry 250 generates the offset voltage responsive to the output current from the current mirror circuitry 220. In example operations, transistors of the temperature compensation circuitry 250 operate in the sub-threshold mode of operation responsive to the magnitude of the output current. In the sub-threshold mode of operation, voltages of transistors of the temperature compensation circuitry 250 have a PTAT bias. The temperature compensation circuitry 250 generates the offset voltage using voltages of the transistors, which creates an offset voltage that has a PTAT bias. The temperature compensation circuitry 250 supplies the offset voltage to the process tracker circuitry 240. An example implementation of the temperature compensation circuitry 250 is illustrated and described in connection with FIGS. 3 and 4, below.

FIG. 3 is a schematic diagram of the example regulator circuitry 200 of FIG. 2. In the example of FIG. 3, the regulator circuitry 200 includes the bias current circuitry 210 of FIG. 2, the current mirror circuitry 220 of FIG. 2, the pass gate circuitry 230 of FIG. 2, the process tracker circuitry 240 of FIG. 2, and the temperature compensation circuitry 250 of FIG. 2. In the example of FIG. 3, the bias current circuitry 210 includes an example transistor 305 and an example resistor 310. In the example of FIG. 3, the current mirror circuitry 220 includes a first example transistor 315, a second example transistor 320, and a third example transistor 325. In the example of FIG. 3, the pass gate circuitry 230 includes an example transistor 330. In the example of FIG. 3, the process tracker circuitry 240 includes a first example transistor 335 and a second example transistor 340. In the example of FIG. 3, the temperature compensation circuitry 250 includes a first example transistor 345, a second example transistor 350, a third example transistor 355, a fourth example transistor 360, a fifth example transistor 365, and a sixth example transistor 370.

The transistor 305 has a first terminal coupled to the transistors 315, 320, 325, second and third terminals coupled to the resistor 310, and a control terminal coupled to a common terminal, which supplies a common potential (e.g., ground). In some examples, the third terminal, which may be referred to as a bulk terminal, is coupled to the common terminal. In the example of FIG. 3, the transistor 305 is a depletion mode transistor. The common terminal controls the transistor 305. When conducting, the transistor 305 sources a bias current ($I_{BIAS}$) from the transistor 315. When the transistor 305 is not conducting, the bias current approaches approximately, preferably exactly, zero amps.

The resistor 310 has a first terminal coupled to the transistor 305 and a second terminal coupled to the common terminal. The resistor 310 generates a potential difference responsive to the transistor 305 supplying the bias current. The potential difference of the resistor 310 is approximately equal to the bias current times the resistance of the resistor 310. The resistor 310 allows the drain voltage of the transistor 305 to be coupled to a voltage greater than the common potential.

In the example of FIG. 3, the transistor 305 is a natural transistor. A natural transistor may be referred to as a native transistor. Natural transistors have a relatively low threshold voltage. In example operation, natural transistors source a current from a drain input (e.g., a voltage at a terminal of the transistor) to pull-down the drain input.

In example operations, where the drain-to-source voltage of the transistor 305 is approximately five times greater than the threshold voltage (Vth NAT) of the transistor 305 the resistance ($R_1$) of the resistor 310 modifies the bias current. For example, using Equation (1), below, adjusting the resistance of the resistor 310 modifies the bias current of the transistor 305. In such examples, the resistor 310 has a resistance that generates a bias current which sets the mode of operation of the temperature compensation circuitry 250 to the sub-threshold operations. Also, as shown in Equation (1), below, parameters of the transistor 305 may be modified to adjust the bias current. For example, the mobility of electrons ($\mu$), the gate oxide capacitance ($C_{OX}$), the width of the transistor 305 (W), the length of the transistor 305 (L), or the subthreshold slope (m).

$$I_{bias} \cong \mu C_{ox} \frac{W}{L}(m-1)V_T^2 \exp\left(\frac{-I_{bias}R_1 - V_{th_{NAT}}}{mV_T}\right) \qquad \text{Equation (1)}$$

The transistor 315 has a first terminal coupled to a supply terminal, which supplies a supply voltage ($V_{DD}$) and a second and control terminal coupled to the transistors 305, 320, 325. The transistor 315 supplies the bias current to the transistor 305. In example operations, the transistor 315 operates as a diode. In such example operations, the transistor 315 sources a current approximately, preferably exactly, equal to the bias current of the transistor 305, which sets the control terminal of the transistor 315 to a reference voltage. The transistor 315 supplies the reference voltage that corresponds to the bias current to the transistors 320, 325.

The transistor 320 has a first terminal coupled to the supply terminal, a second terminal coupled to the transistors 355, 360, and a control terminal coupled to the transistors 305, 315, 325. The transistor 315 controls the transistor 320. The transistor 320 receives the reference voltage from the transistor 315. The transistor 320 supplies a replica of the bias current to the transistor 360 responsive to the reference voltage from the transistor 315. Advantageously, the transistor 320 mirrors the bias current.

The transistor 325 has a first terminal coupled to the supply terminal, a second terminal coupled to the transistor 330, 370, and a control terminal coupled to the transistors 305, 315, 320. The transistor 315 controls the transistor 325. The transistor 325 receives the reference voltage from the transistor 315. The transistor 325 supplies a replica of the bias current to the transistor 370 responsive to the reference voltage from the transistor 315. Advantageously, the transistor 325 mirrors the bias current.

The transistor 330 has a first terminal coupled to the supply terminal, a second terminal coupled to the transistor 335 and that may be coupled to external circuitry, and a control terminal coupled to the transistors 325, 370. The voltages of the transistors 365, 370 control the transistor 330. In example operations, feedback current from the transistors 335, 340 contributes to the control of the transistor 330. Such a combination of currents and voltages from the process tracker circuitry 240 and the temperature compensation circuitry 250 create a feedback loop that controls the transistor 330. The transistor 330 supplies current from the supply terminal to the transistor 335 and the external circuitry.

The transistor 335 has a first terminal coupled to the transistor 330 and that may be coupled to external circuitry. The transistor 335 has a second terminal and a control terminal that are both coupled to the transistor 340. The transistor 335 is a p-channel transistor. The transistor 340 has a first terminal and a control terminal coupled to the transistor 335 and a second terminal coupled to the transistor 365, 370. The transistor 340 is an n-channel transistor. Current from the transistor 365 sets the current of the transistors 335, 340, which sources current from the transistor 330. When conducting, the transistors 335, 340 generate a voltage difference approximately equal to the gate-to-source voltage of the transistor 335 plus the gate-to-source voltage of the transistor 340. The transistors 335, 340 generate the output voltage of the regulator circuitry 200 to be approximately equal to the offset voltage from the temperature compensation circuitry 250 plus the voltage difference across the transistors 335, 340. In example operations, the voltage difference across the transistors 335, 340 has a CTAT bias. The voltage difference across the transistors 335, 340 decreases as the temperature increases responsive to the CTAT bias. However, the PTAT bias of the offset voltage, across the transistor 365, compensates the output voltage of the regulator circuitry 200 for the CTAT bias of the voltage difference across the transistors 335, 340.

The transistor 345 has a first terminal coupled to the transistor 350, a second terminal coupled to the common potential, and a control terminal coupled to the transistors 350, 355, 365. The bias current controls the transistor 345. The transistor 345 has a first threshold voltage ($V_{th1}$), which controls operations of the transistor 345. The transistor 345 has a first constant ($\beta_1$), which is proportional to the size of the transistor 345. The transistor 345 generates a first gate-to-source voltage ($V_{gs1}$) responsive to the bias current.

The transistor 350 has a first terminal coupled to the transistors 345, 355, 365, a second terminal coupled to the 345, and a control terminal coupled to the transistors 355, 360, 370. The bias current controls the transistor 350. The transistor 350 has a second threshold voltage ($V_{th2}$), which controls operations of the transistor 350. The transistor 350 has a second constant ($\beta_2$), which is proportional to the size of the transistor 350. The transistor 350 generates a second gate-to-source voltage ($V_{gs2}$) responsive to the bias current.

The transistor 355 has a first terminal coupled to the transistors 345, 350, 365, a second terminal coupled to the transistors 350, 360, 370, and a control terminal coupled to the transistors 320, 360. The bias current controls the transistor 355. The transistor 355 has a third threshold voltage ($V_{th3}$), which controls operations of the transistor 355. The transistor 355 has a third constant ($\beta_3$), which is proportional to the size of the transistor 355. The transistor 355 generates a third gate-to-source voltage ($V_{gs3}$) responsive to the bias current.

The transistor 360 has a first terminal and a control terminal coupled to the transistors 320, 355 and a second terminal coupled to the transistors 350, 355, 370. The bias current controls the transistor 360. The transistor 360 has a fourth threshold voltage ($V_{th4}$), which controls the operations of the transistor 360. The transistor 360 has a fourth constant ($\beta_4$), which is proportional to a size of the transistor 360. The transistor 360 generates a fourth gate-to-source voltage ($V_{gs4}$) responsive to the bias current.

The transistor 365 has a first terminal coupled to the transistors 340, 370, a second terminal coupled to the common terminal, and a control terminal coupled to the transistors 345, 350, 355. The bias current and the feedback current control the transistor 365. The transistor 365 has a fifth threshold voltage ($V_{th5}$), which controls operations of the transistor 365. The transistor 365 has a fifth constant ($\beta_5$), which is proportional to a size of the transistor 365. The transistor 365 generates a fifth gate-to-source voltage ($V_{gs5}$) responsive to the bias current and the feedback current. In some examples, the transistors 345, 365 are sized to have the transistor 365 source a current approximately equal, preferably exactly, equal to two times the current flowing through the transistor 345. In such examples, the current flowing through the transistor 365 is approximately equal to two times the bias current.

The transistor 370 has a first terminal coupled to the transistors 325, 330, a second terminal coupled to the transistors 340, 365, and a control terminal coupled to the transistors 350, 355, 360. The bias current and the feedback current control the transistor 370. The transistor 370 has a sixth threshold voltage ($V_{th6}$), which controls operations of the transistor 370. The transistor 370 has a sixth constant ($\beta_6$), which is proportional to the size of the transistor 370. The transistor 370 generates a sixth gate-to-source voltage ($V_{gs6}$) responsive to the bias current and the feedback current.

In example operations, the offset voltage of the temperature compensation circuitry 250 is approximately equal to the voltage at the terminal coupled to the transistors 340, 365, 370. In such example operations, the offset voltage is approximately equal to the first gate-to-source voltage plus the third gate-to-source voltage minus the fourth gate-to-source voltage minus the sixth gate-to-source voltage. For example, using Equation (2), below, to determine the offset voltage.

$$V_X = V_{gs1} + V_{gs3} - V_{gs4} - V_{gs6}; \qquad \text{Equation (2)}$$

In other examples, the offset voltage of the temperature compensation circuitry 250 may be written in terms of the threshold voltages of the transistors 345, 350, 355, 360, 365, 370. In such examples, the offset voltage is approximately equal to the first threshold voltage plus the third threshold voltage minus the fourth threshold voltage minus the sixth threshold voltage plus a multiplication of a slope constant (m), a temperature dependent voltage ($V_T$), and a natural log of a multiplication of the fourth and sixth constants ($\beta_4$, $\beta_6$) divided by the first and third constants ($\beta_1$, $\beta_3$). For example, Equation (3), below, may be used to determine the offset voltage. However, in example operations, the voltage differences between the first and fourth threshold voltages and the third and sixth threshold voltages are relatively small compared to the multiplication of a slope constant (m), a temperature dependent voltage ($V_T$), and a natural log of a multiplication of the fourth and sixth constants ($\beta_4$, $\beta_6$) divided by the first and third constants ($\beta_1$, $\beta_3$). In such example operations, the transistors 345, 360 are selected to have approximately the same magnitude of the threshold voltage and the transistors 355, 370 are selected to have approximately the same magnitude of the threshold voltage to reduce contributions to the offset voltage.

$$V_X = V_{th1} + V_{th3} - V_{th4} - V_{th6} + mV_T \ln\left(\frac{\beta_4\beta_6}{\beta_1\beta_3}\right); \qquad \text{Equation (3)}$$

Advantageously, the offset voltage increases as the temperature dependent voltage of Equation (3), above, increases. Advantageously, the temperature dependent voltage of the offset voltage has a PTAT bias. Advantageously, the transistors 345, 350, 360, 365, 370 may be sized to have constants that set the offset voltage to a desired value.

In the example of FIG. 3, the transistors 305, 340, 345, 350, 355, 360, 365, 370 are n-channel metal-oxide semiconductor field-effect transistors (MOSFETs). Alternatively, the transistors 305, 340, 345, 350, 355, 360, 365, 370 may be n-channel field-effect transistors (FETs), n-channel insulated-gate bipolar transistors (IGBTs), n-channel junction field effect transistors (JFETs), NPN bipolar junction transistors (BJTs) and/or, with slight modifications, p-type equivalent devices. In the example of FIG. 3, the transistors 315, 320, 325, 330, 335 are p-channel MOSFETs. Alternatively, the transistors 315, 320, 325, 330, 335 may be p-channel FETs, p-channel IGBTs, p-channel JFETs, NPN BJTs, and/or, with slight modifications, N-type equivalent devices. The transistors 305, 350, 355, 370 are depletion mode devices, such as natural transistors. The transistors 315, 320, 325, 330 are enhancement mode devices that have a relatively thick oxide. The transistors 335, 340, 345, 360, 365 are enhancement mode devices. Furthermore, the transistors 305, 315, 320, 325, 330, 335, 340, 345, 350, 355, 360, 365, 370 may be implemented in/over a silicon substrate (Si), a silicon carbide substrate (SIC), a gallium nitride substrate (GaN) or a gallium arsenide substrate (GaAs).

Figure 4:
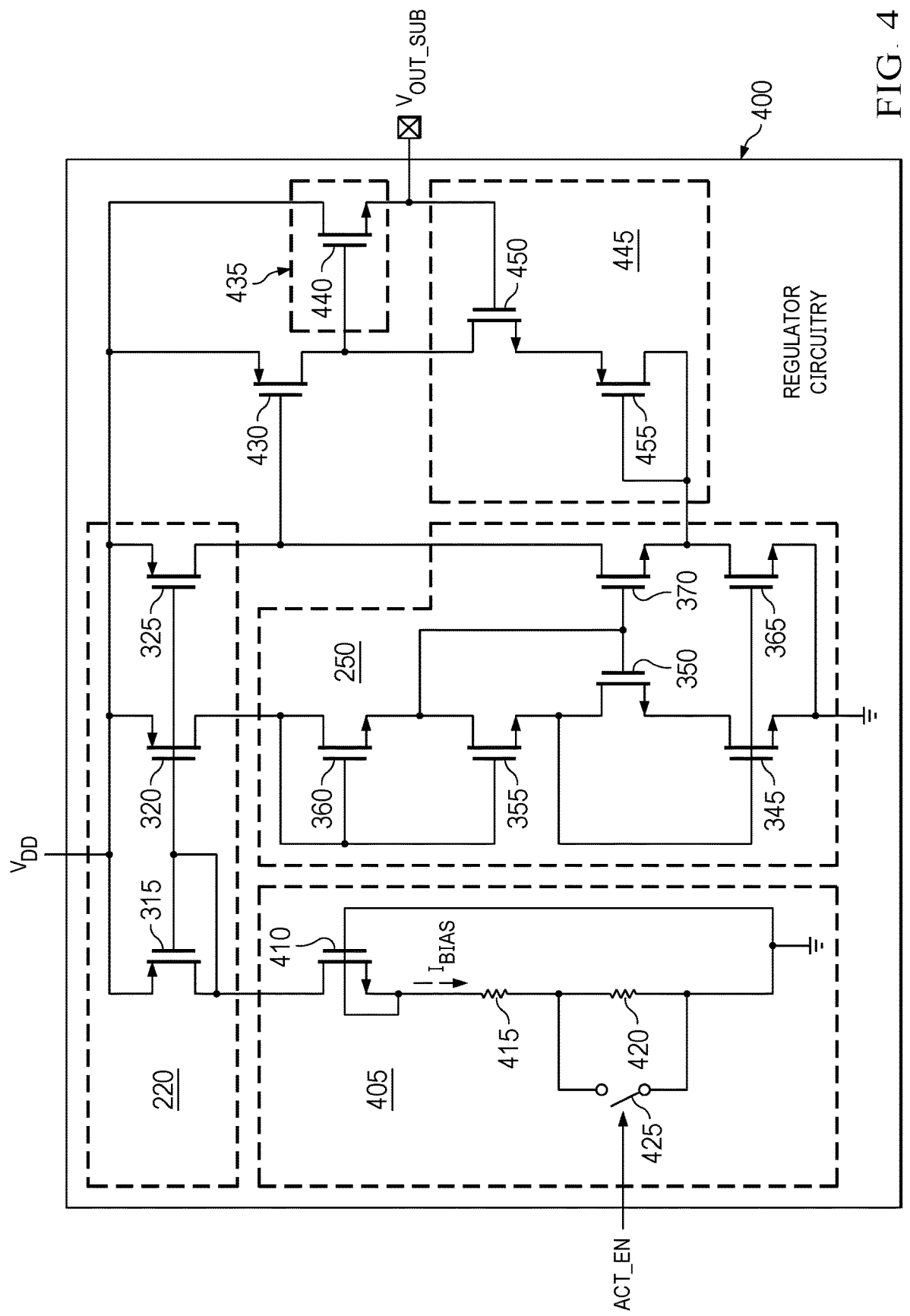
FIG. 4 is a schematic diagram of another example of the regulator circuitry of FIGS. 1 and 2, which adjusts an output current responsive to modifying a bias current.

FIG. 4 is a schematic diagram of example regulator circuitry 400, which is another example of the regulator circuitry 150 of FIG. 1 and the regulator circuitry 200 of FIGS. 2 and 3. In the example of FIG. 4, the regulator circuitry 400 includes the current mirror circuitry 220 of FIGS. 2 and 3, the temperature compensation circuitry 250 of FIGS. 2 and 3, the transistors 315, 320, 325, 345, 350, 355, 360, 365, 370 of FIG. 3, example bias current circuitry 405, a first example transistor 410, a first example resistor 415, a second example resistor 420, example switch circuitry 425, a second example transistor 430, example pass gate circuitry 435, a third example transistor 440, example process tracker circuitry 445, a fourth example transistor 450, and a fifth example transistor 455. The regulator circuitry 400 generates an output voltage ($V_{OUT\_SUB}$) proportional to an offset voltage ($V_X$) from the temperature compensation circuitry 250 plus the gate-to-source voltages of the transistors 450, 455.

The bias current circuitry 405 has a first terminal coupled to the current mirror circuitry 220, a second terminal coupled to a common terminal, which supplies a common potential (e.g., ground), and a control terminal that may be coupled to the controller circuitry 120 of FIG. 1. In the example of FIG. 4, the bias current circuitry 405 includes the transistor 410, the resistors 415, 420, and the switch circuitry 425. The bias current circuitry 405 receives the active mode indication from the controller circuitry 120. The bias current circuitry 405 generates a bias current of one of a first magnitude or a second magnitude responsive to the active mode indication. In example operations, the bias current circuitry 405 increases the bias current responsive to the active mode indication from the controller circuitry 120.

The transistor 410 has a first terminal coupled to the transistor 315, a second terminal and a third terminal coupled to the resistor 415, and a control terminal coupled to the common terminal. In the example of FIG. 4, the transistor 410 is a depletion mode transistor. The common terminal controls the transistor 410. When conducting, the transistor 410 sources the bias current ($I_{BIAS}$) from the transistor 315. When not conducting, the transistor 410 prevents the generation of the bias current.

The resistor 415 has a first terminal coupled to the transistor 410 and a second terminal coupled to the resistor 420 and the switch circuitry 425. The resistor 420 has a first terminal coupled to the resistor 415 and the switch circuitry 425 and a second terminal coupled to the common terminal. The resistor 415 has a first resistance and the resistor 420 has a second resistance. The resistors 415, 420 are structured as voltage divider circuitry between the transistor 410 and the common terminal.

The switch circuitry 425 has a first terminal coupled to the resistors 415, 420 and a second terminal coupled to the common terminal. The controller circuitry 120 controls the switch circuitry 425 using the active mode indication. The switch circuitry 425 controls the resistance coupled between the transistor 410 and the common terminal. When open, the switch circuitry 425 allows the resistance of both of the resistors 415, 420 to be coupled to the transistor 410. For example, the bias current may be determined using Equation (4), below. When closed, the switch circuitry 425 shorts the resistor 420, which sets the resistance between the transistor 410 and the common terminal to be approximately equal to the resistance of the resistor 415. For example, the bias current may be determined using Equation (1), below. Advantageously, the bias current circuitry 405 may adjust the magnitude of the bias current responsive to a mode of operation of the device 100 of FIG. 1. The bias current circuitry 405 may be implemented in regulator circuitry 200 of FIGS. 2 and 3.

$$I_{bias} \cong \mu C_{ox} \frac{W}{L}(m-1)V_T^2 \exp\left(\frac{-I_{bias}(R_1 + R_2) - V_{th_{NAT}}}{mV_T}\right); \qquad \text{Equation (4)}$$

The transistor 430 has a first terminal coupled to a supply terminal, which supplies a supply voltage ($V_{DD}$), a second terminal coupled to the transistors 440, 450, and a control terminal coupled to the 325, 370. The transistor 430 is a p-channel depletion mode transistor. The voltages of the transistors 365, 370 control the transistor 430. In example operations, feedback current from the transistors 450, 455 contributes to the control of the transistor 430. Such a combination of currents and voltages from the process tracker circuitry 445 and the temperature compensation circuitry 250 are structured as a first feedback loop that controls the transistor 430. The transistor 430 supplies current from the supply terminal to the transistor 450, which sets a voltage of the transistor 440.

The pass gate circuitry 435 has a first terminal coupled to the supply terminal, a second terminal coupled to the transistors 430, 450, and a third terminal coupled to the transistor 450 and that may be coupled to external circuitry. In the example of FIG. 4, the pass gate circuitry 435 includes the transistor 440. The pass gate circuitry 435 supplies current to the transistor 450 and the external circuitry. The transistor 450 is structured as a second feedback loop to control the pass gate circuitry 435. The pass gate circuitry 435 of FIG. 4 operates similar to the pass gate circuitry 230 of FIGS. 2 and 3. However, contributions from the first and second feedback loops control the pass gate circuitry 435.

The transistor 440 has a first terminal coupled to the supply terminal, a second terminal coupled to the transistor 450 and that may be coupled to external circuitry, and a control terminal coupled to the transistors 430, 450. The transistor 440 is an n-channel depletion mode transistor. The voltages of the transistors 430, 450 control the transistor 440. In example operations, feedback current from the transistor 450 contributes to the control of the transistor 440. Such a combination of currents and voltages from the transistor 430 and the process tracker circuitry 445 are structured as the second feedback loop that controls the transistor 440. The transistor 440 supplies current from the supply terminal to the transistor 450 and the external circuitry.

The process tracker circuitry 445 has a first terminal coupled to the transistors 430, 440, a second terminal coupled to the transistor 440 and that may be coupled to external circuitry, and a third terminal coupled to the transistors 365, 370. In the example of FIG. 4, the process tracker circuitry 445 includes the transistors 450, 450. The process tracker circuitry 445 is another example of the process tracker circuitry 240 of FIGS. 2 and 3. However, unlike the process tracker circuitry 240, the process tracker circuitry 445 includes an alternate configuration of the transistors 450, 455. The process tracker circuitry 445 contributes to the control the pass gate circuitry 435 to set the output voltage of the regulator circuitry 400 to be approximately equal to the offset voltage from the temperature compensation circuitry 250 plus the threshold voltages of the transistors 450, 455. Advantageously, the offset voltage has a PTAT bias that compensates for the CTAT bias of the transistors 450, 455.

The transistor 450 has a first terminal coupled to the transistors 430, 440, a second terminal coupled to the transistor 455, and a control terminal coupled to the transistor 440 and that may be coupled to the external circuitry. The transistor 450 is an n-channel enhancement mode transistor. The transistor 455 has a first terminal coupled to the transistor 450 and a second terminal and a control terminal coupled to the transistors 365, 370. The transistor 455 is a p-channel enhancement mode transistor. The temperature compensation circuitry 250 offsets the gate-to-source voltages of the transistors 450, 455 by the offset voltage. The transistors 450, 455 set the output voltage of the regulator circuitry 400 to be approximately equal to the offset voltage plus the gate-to-source voltages of both of the transistors 450, 455. Advantageously, the PTAT bias of the offset voltage reduces variations in the output voltage responsive to the CTAT bias of the transistors 450, 455.

In the example of FIG. 4, the transistors 345, 350, 355, 360, 365, 370, 410, 440, 450 are n-channel metal-oxide semiconductor field-effect transistors (MOSFETs). Alternatively, the transistors 345, 350, 355, 360, 365, 370, 410, 440, 450 may be n-channel FETs, n-channel IGBTs, n-channel JFETs, NPN BJTs and/or, with slight modifications, p-type equivalent devices. In the example of FIG. 4, the transistors 315, 320, 325, 430, 455 are p-channel MOSFETs. Alternatively, the transistors 315, 320, 325, 430, 455 may be p-channel FETs, p-channel IGBTs, p-channel JFETs, NPN BJTs, and/or, with slight modifications, N-type equivalent devices. The transistors 315, 320, 325, 350, 355, 370, 410, 430, 440 are depletion mode devices, such as natural transistors. The transistors 345, 360, 365, 455 are enhancement mode devices. Furthermore, the transistors 315, 320, 325, 345, 350, 355, 360, 365, 370, 410, 430, 450, 455 may be implemented in/over a silicon substrate (Si), a silicon carbide substrate (SiC), a gallium nitride substrate (GaN) or a gallium arsenide substrate (GaAs).

Figure 5A:
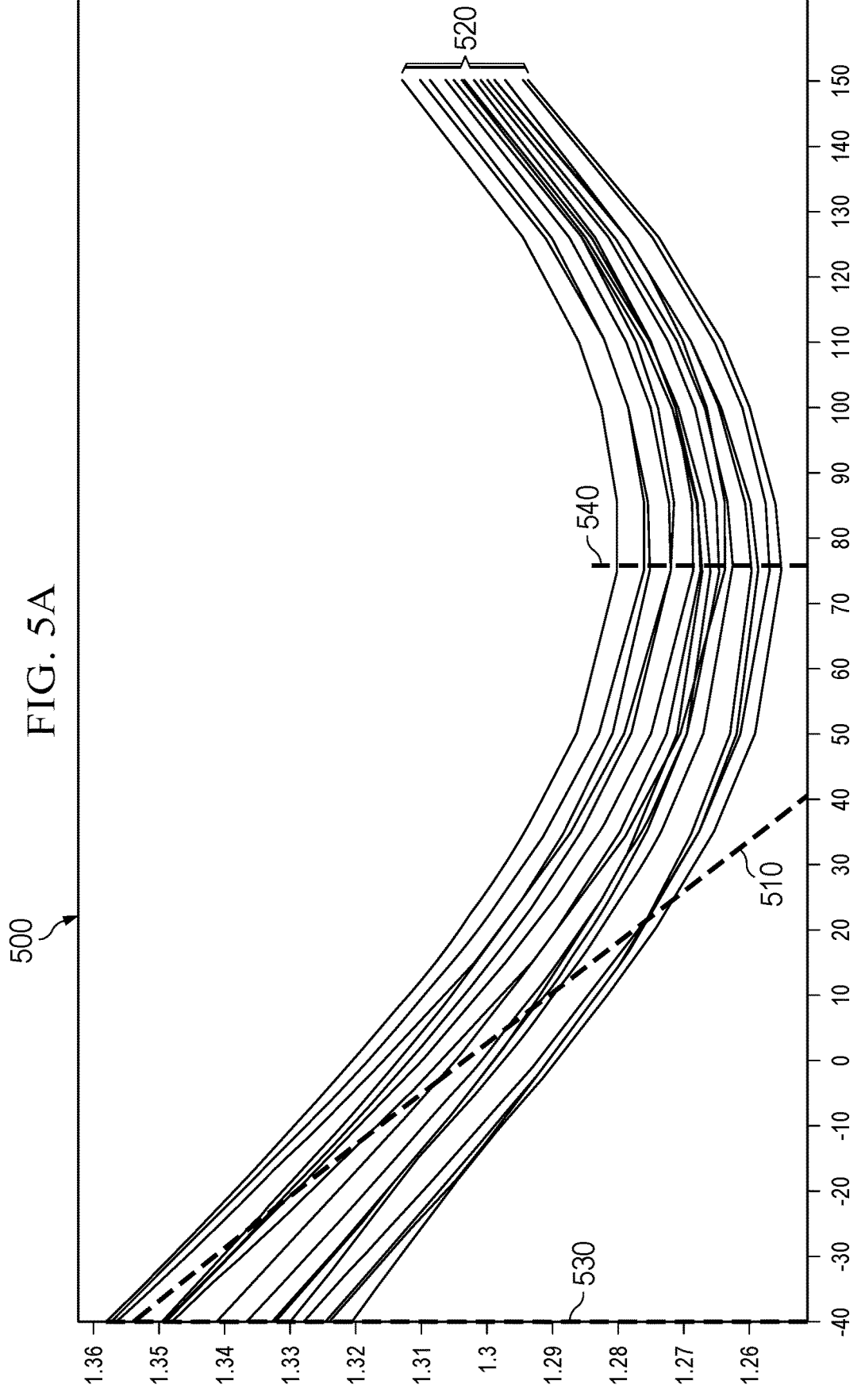
FIGS. 5A and 5B are plots of example compensations to the output voltage of the regulator circuitry of FIG. 1, 2, 3, or 4 across a range of operating temperatures.

FIG. 5A is a plot 500 of example operations of the regulator circuitry 150, 200, 400 of FIG. 1, 2, 3, or 4. In the example of FIG. 5A, the plot 500 includes a first example compensated output voltage 510 and a second example compensated output voltages 520. The compensated output voltage 510 illustrates operations of example regulator circuitry that does not compensate the CTAT bias of the process tracker circuitry 240, 445 of FIG. 2, 3, or 4. For example, the compensated output voltage 510 has a relatively low offset voltage. In such examples, the temperature compensation circuitry 250 of FIGS. 2, 3, and 4 fail to effectively compensate the CTAT bias of the process tracker circuitry 240 by generating a relatively low offset voltage. The compensated output voltages 520 illustrate operations of the regulator circuitry 150, 200, 400 including the temperature compensation circuitry 250 generating the offset voltage, which has a PTAT bias that compensates for the CTAT bias of the process tracker circuitry 240, 445.

At a first temperature 530, which is a relatively low temperature, the compensated output voltages 510, 520 are approximately equal. At the temperature 530, the process tracker circuitry 240, 445 have a relatively high CTAT bias and the offset voltage of the temperature compensation circuitry 250 has a relatively low PTAT bias.

At a second temperature 540, which is a relatively moderate temperature, the compensated output voltage 510 has substantially decreased responsive to a decrease in the CTAT bias between the temperatures 530, 540. At the temperature 540, the compensated output voltages 520 transition from decreasing to increasing responsive to the increase in the PTAT bias as the temperature increases. After the temperature 540, the CTAT bias of the process tracker circuitry 240, 445 continues to decrease and the PTAT bias of the offset voltage of the temperature compensation circuitry 250 continues to increase. Advantageously, the temperature compensation circuitry 250 compensates the output voltage of the regulator circuitry 150, 200, 400 for decreases in the CTAT bias.

Figure 5B:
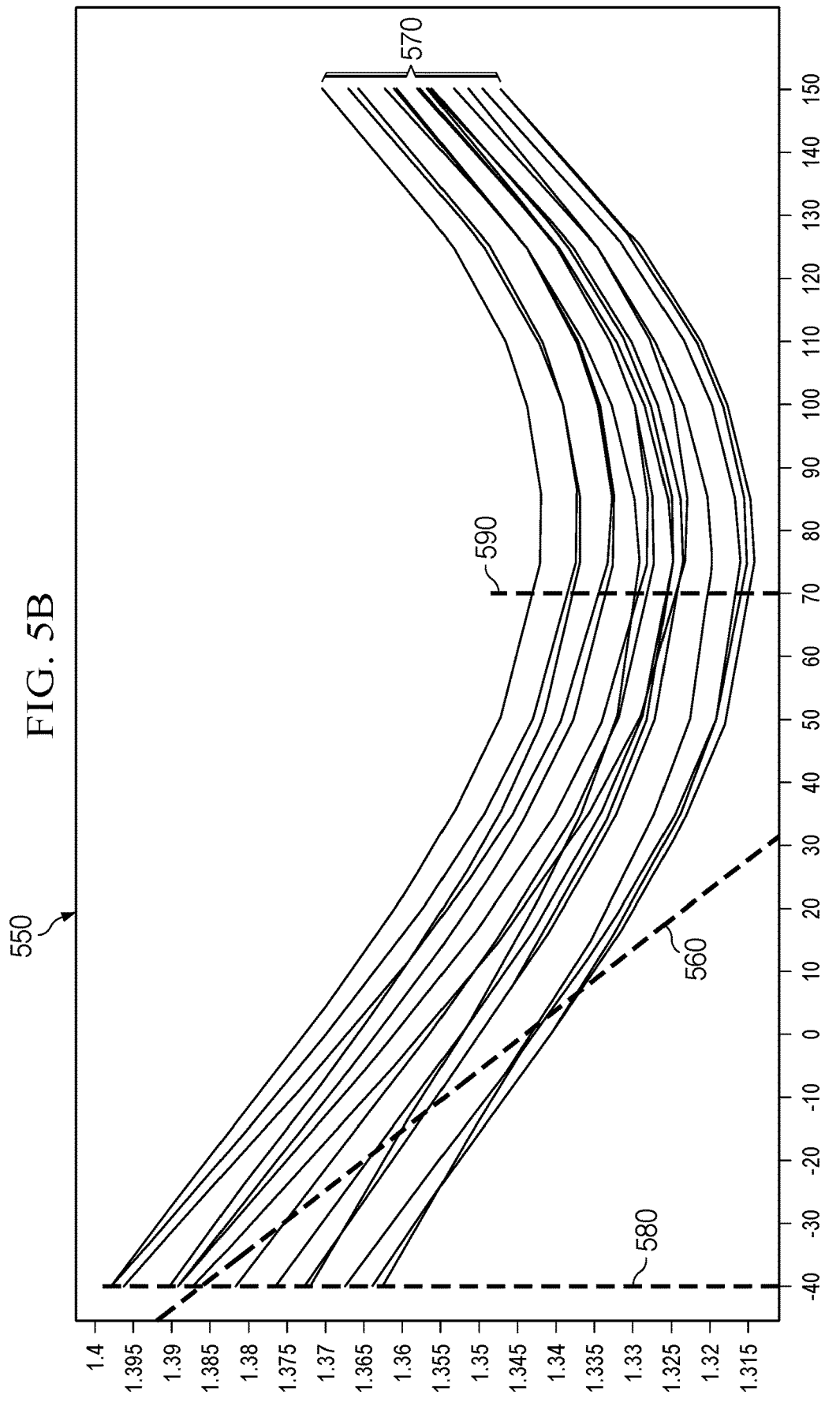

FIG. 5B is a plot 550 of example operations of the regulator circuitry 150, 200, 400 of FIG. 1, 2, 3, or 4 with an increased bias current. For example, the regulator circuitry 400 after closing the switch circuitry 425 of FIG. 4. In the example of FIG. 5B, the plot 550 includes a first example compensated output voltage 560 and example compensated output voltages 570. The compensated output voltage 560 illustrates operations of example regulator circuitry that does not compensate the CTAT bias of the process tracker circuitry 240, 445 of FIG. 2, 3, or 4. For example, the compensated output voltage 560 has a relatively low offset voltage. In such examples, the temperature compensation circuitry 250 of FIGS. 2, 3, and 4 fail to effectively compensate the CTAT bias of the process tracker circuitry 240 by generating a relatively low offset voltage. The compensated output voltages 570 illustrate operations of the regulator circuitry 150, 200, 400 including the temperature compensation circuitry 250 generating the offset voltage, which has a PTAT bias that compensates for the CTAT bias of the process tracker circuitry 240, 445. Further, in the example of FIG. 5B, the device 100 is in an active mode of operation. In the example of FIG. 5B, the active mode indication opened the switch circuitry 425 of FIG. 4 to increase the bias current.

At a first temperature 580, which is a relatively low temperature, the compensated output voltage 560 and the compensated output voltages 570 are approximately equal. At the temperature 580, the process tracker circuitry 240, 445 have a relatively high CTAT bias and the offset voltage of the temperature compensation circuitry 250 has a relatively low PTAT bias.

At a second temperature 590, which is a relatively moderate temperature, the compensated output voltage 560 has substantially decreased responsive to a decrease in the CTAT bias between the temperatures 580, 590. At the temperature 590, the compensated output voltages 570 transition from decreasing to increasing responsive to the increase in the PTAT bias as the temperature increases. After the temperature 590, the CTAT bias of the process tracker circuitry 240, 445 continues to decrease and the PTAT bias of the offset voltage of the temperature compensation circuitry 250 continues to increase. Advantageously, the temperature compensation circuitry 250 compensates the output voltage of the regulator circuitry 150, 200, 400 for decreases in the CTAT bias.

Figure 6:
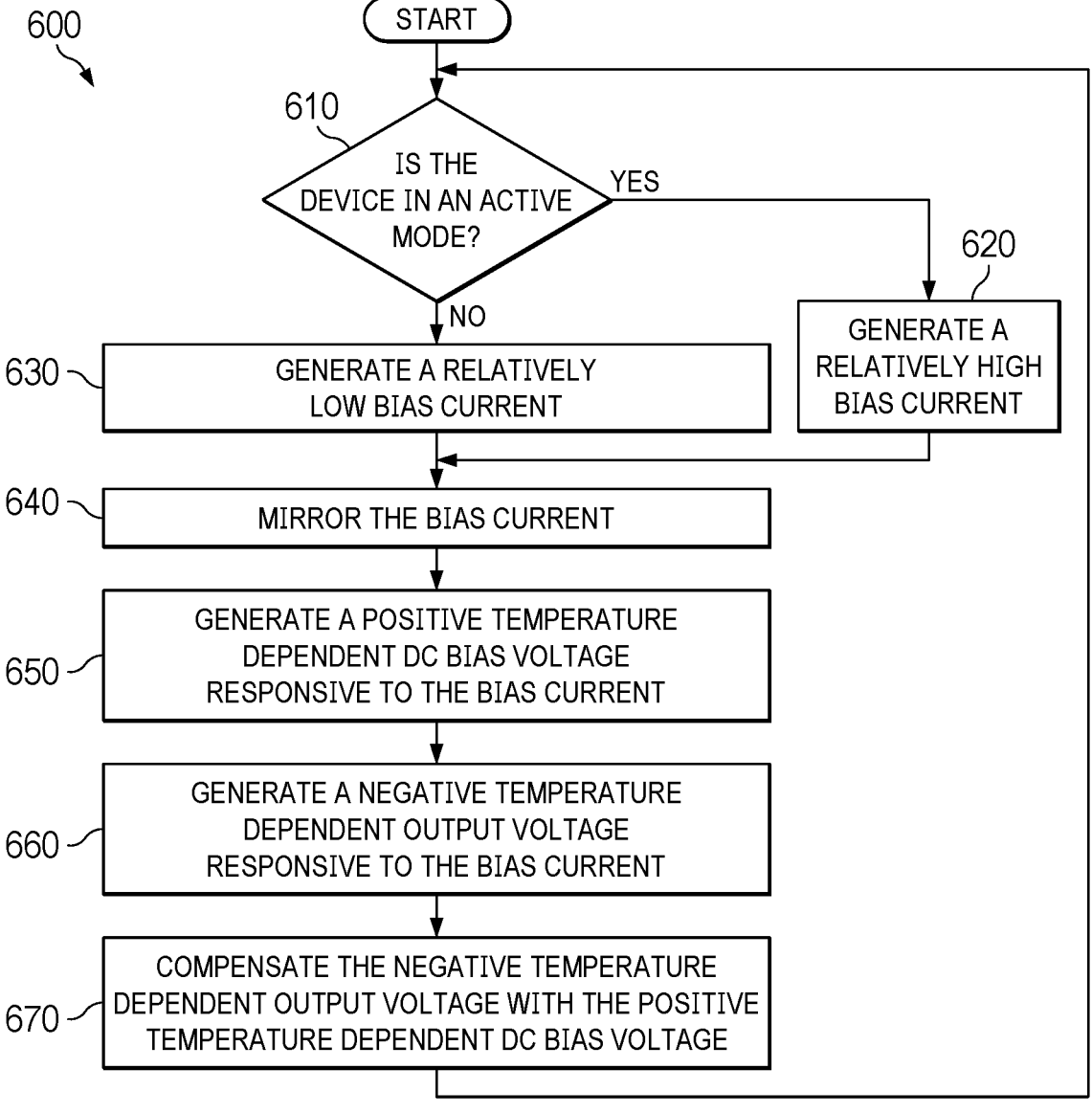
FIG. 6 is a flowchart representative of example operations that may be executed, instantiated, and/or performed to implement the regulator circuitry of FIG. 1, 2, 3, or 4.

FIG. 6 is a flowchart representative of example operations 600 that may be executed, instantiated, and/or performed to implement the regulator circuitry 150, 200, 400 of FIG. 1, 2, 3, or 4. The example operations 600 begin at Block 610, at which, the controller circuitry 120 of FIG. 1 determines if the device is in an active mode. In some examples, the controller circuitry 120 determines the mode of operation of the device 100 of FIG. 1 responsive to periodic timing of switching between the active mode and the sleep mode. In the active mode, the active mode indication enables the regulator circuitry 130 of FIG. 1, which supplies power to the active mode circuitry 140 of FIG. 1.

If the controller circuitry 120 determines that the device is in an active mode (e.g., Block 610 returns a result of YES), the bias current circuitry 405 of FIG. 4 generates a relatively high bias current. (Block 620). In some examples, the controller circuitry 120 closes the switch circuitry 425 of FIG. 4 to increase the bias current, as shown in Equation (1), above. In such examples, increasing the bias current increases the output current of the regulator circuitry 150, 200, 400.

If the controller circuitry 120 determines that the device is not in an active mode (e.g., Block 610 returns a result of NO), the bias current circuitry 210, 405 of FIG. 2, 3, or 4 generates a relatively low bias current. (Block 630). In some examples, the controller circuitry 120 opens the switch circuitry 425 to decrease the bias current, as shown in Equation (4), above. In such examples, decreasing the bias current decreases the output current of the regulator circuitry 150, 200, 400.

The current mirror circuitry 220 of FIGS. 2, 3, and 4 mirrors the bias current. (Block 640). In some examples, the transistors 320, 325 of FIGS. 3 and 4 replicate the current supplied by the transistor 315 of FIGS. 3 and 4. In such examples, the bias current circuitry 210, 405 source the bias current from the transistor 315.

The temperature compensation circuitry 250 of FIGS. 2, 3, and 4 generates a positive temperature dependent DC bias voltage responsive to the bias current. (Block 650). In some examples, the temperature compensation circuitry 250 uses the transistors 345, 350, 355, 360, 365, 370 of FIGS. 3 and 4 to generate the offset voltage that has a PTAT bias. For example, as shown in Equation (3), the offset voltage of the temperature compensation circuitry 250 increases as the temperature dependent voltage increases. In such examples, adjusting the sizes of the transistors 345, 350, 355, 360, 365, 370 modifies the constants and further controls the offset voltage.

The process tracker circuitry 230, 445 of FIG. 2, 3, or 4 generates a negative temperature dependent output voltage responsive to the bias current. (Block 660). In some examples, the transistors 335, 340 of FIG. 3 or the transistors 450, 455 of FIG. 4 have gate-to-source voltages that have a CTAT bias. In such examples, the gate-to-source voltages of the transistors 335, 340, 450, 455 decrease as the temperature increases responsive to the CTAT bias.

The process tracker circuitry 230, 445 compensates the negative temperature dependent output voltage with the positive temperature dependent DC bias voltage. (Block 670). In some examples, the temperature compensation circuitry 250 offsets the gate-to-source voltages of the transistors 335, 340, 450, 455. In such examples, the transistors 335, 340, 450, 455 regulate the output voltage of the regulator circuitry 150, 200, 400 to be approximately equal to the offset voltage plus the gate-to-source voltages of one of the process tracker circuitry 230, 445. Control proceeds to return to Block 610.

Although example methods are described with reference to the flowchart illustrated in FIG. 6, many other methods of implementing the regulator circuitry 150, 200, 400 may alternatively be used in this description. For example, the order of execution of the blocks may be changed, and/or some of the blocks described may be changed, eliminated, or combined. Similarly, additional operations may be included in the manufacturing process before, in between, or after the blocks shown in the illustrated examples.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities, etc., the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities, etc., the phrase "at least one of A or B" is intended to refer to implementations including any of (1) at least one A, (2) at least one B, or (3) at least one A and at least one B.

As used herein, singular references (e.g., "a," "an," "first," "second," etc.) do not exclude a plurality. The term "a" or "an" object, as used herein, refers to one or more of that object. The terms "a" (or "an"), "one or more," and "at least one" are used interchangeably herein. Furthermore, although individually listed, a plurality of means, elements, or actions may be implemented by, e.g., the same entity or object. Also, although individual features may be included in different examples or claims, these may possibly be combined, and the inclusion in different examples or claims does not imply that a combination of features is not feasible and/or advantageous.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the described examples. In some examples, the descriptor "first" may be used to refer to an element in the detailed description, while the same element may be referred to in a claim with a different descriptor such as "second" or "third." In such instances, such descriptors are used merely for identifying those elements distinctly within the context of the discussion (e.g., within a claim) in which the elements might, for example, otherwise share a same name.

As used herein, "approximately" and "about" modify their subjects/values to recognize the potential presence of variations that occur in real world applications. For example, "approximately" and "about" may modify dimensions that may not be exact due to manufacturing tolerances and/or other real world imperfections. For example, "approximately" and "about" may indicate such dimensions may be within a tolerance range of +/−10% unless otherwise specified herein.

As used herein "substantially real time" refers to occurrence in a near instantaneous manner recognizing there may be real world delays for computing time, transmission, etc. Thus, unless otherwise specified, "substantially real time" refers to real time+1 second.

As used herein, the phrase "in communication," including variations thereof, encompasses direct communication and/or indirect communication through one or more intermediary components, and does not require direct physical (e.g., wired) communication and/or constant communication, but rather also includes selective communication at periodic intervals, scheduled intervals, aperiodic intervals, and/or one-time events.

As used herein, "programmable circuitry" is defined to include (i) one or more special purpose electrical circuits (e.g., an application specific circuit (ASIC)) structured to perform specific operation(s) and including one or more semiconductor-based logic devices (e.g., electrical hardware implemented by one or more transistors), and/or (ii) one or more general purpose semiconductor-based electrical circuits programmable with instructions to perform specific functions(s) and/or operation(s) and including one or more semiconductor-based logic devices (e.g., electrical hardware implemented by one or more transistors). Examples of programmable circuitry include programmable micropro-cessors such as Central Processor Units (CPUs) that may execute first instructions to perform one or more operations and/or functions, Field Programmable Gate Arrays (FPGAs)

that may be programmed with second instructions to con-figure and/or structure the FPGAs to instantiate one or more operations and/or functions corresponding to the first instructions, Graphics Processor Units (GPUs) that may execute first instructions to perform one or more operations and/or functions, Digital Signal Processors (DSPs) that may execute first instructions to perform one or more operations and/or functions, XPUs, Network Processing Units (NPUs) one or more microcontrollers that may execute first instruc-tions to perform one or more operations and/or functions and/or integrated circuits such as Application Specific Inte-grated Circuits (ASICs). For example, an XPU may be implemented by a heterogeneous computing system includ-ing multiple types of programmable circuitry (e.g., one or more FPGAs, one or more CPUs, one or more GPUs, one or more NPUs, one or more DSPs, etc., and/or any combination (s) thereof), and orchestration technology (e.g., application programming interface(s) (API(s)) that may assign comput-ing task(s) to whichever one(s) of the multiple types of programmable circuitry is/are suited and available to per-form the computing task(s).

As used herein integrated circuit/circuitry is defined as one or more semiconductor packages containing one or more circuit elements such as transistors, capacitors, induc-tors, resistors, current paths, diodes, etc. For example, an integrated circuit may be implemented as one or more of an ASIC, an FPGA, a chip, a microchip, programmable cir-cuitry, a semiconductor substrate coupling multiple circuit elements, a system on chip (SoC), etc.

In this description, the term "and/or" (when used in a form such as A, B and/or C) refers to any combination or subset of A, B, C, such as: (a) A alone; (b) B alone; (c) C alone; (d) A with B; (c) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

In this description, the term "couple" may cover connec-tions, communications, or signal paths that enable a func-tional relationship consistent with this description. For example, if device A generates a signal to control device B to perform an action: (a) in a first example, device A is coupled to device B by direct connection; or (b) in a second example, device A is coupled to device B through interven-ing component C if intervening component C does not alter the functional relationship between device A and device B, such that device B is controlled by device A via the control signal generated by device A.

Numerical identifiers such as "first," "second," "third," etc. are used merely to distinguish between elements of substantially the same type in terms of structure and/or function. These identifiers as used in the detailed description do not necessarily align with those used in the claims.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a com-bination thereof.

As used herein, the terms "terminal," "node," "intercon-nection," "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/–10 percent of the stated value, or, if the value is zero, a reasonable range of values around zero.

Modifications are possible in the described examples, and other examples are possible, within the scope of the claims.

What is claimed is:

1. An apparatus comprising:
pass gate circuitry having a first terminal and a second terminal;
process tracker circuitry having a first terminal and a second terminal, the first terminal of the process tracker circuitry coupled to the first terminal of the pass gate circuitry; and
temperature compensation circuitry having a first terminal and a second terminal, the first terminal of the temperature compensation circuitry coupled to the second terminal of the process tracker circuitry, and the second terminal of the temperature compensation circuitry coupled to the second terminal of the pass gate circuitry, wherein the temperature compensation circuitry further has a third terminal, the apparatus further comprising current mirror circuitry having a first terminal and a second terminal, the first terminal of the current mirror circuitry coupled to the second terminal of the pass gate circuitry and the second terminal of the temperature compensation circuitry, the second terminal of the current mirror circuitry coupled to the third terminal of the temperature compensation circuitry.

2. The apparatus of claim 1, wherein the current mirror circuitry further has a third terminal, the apparatus further comprising bias current circuitry having a terminal coupled to the third terminal of the current mirror circuitry.

3. The apparatus of claim 1, wherein the pass gate circuitry includes a transistor having a first terminal, a second terminal, and a control terminal, the first terminal of the transistor coupled to a supply terminal, the second terminal of the transistor coupled to the first terminal of the process tracker circuitry, the control terminal of the transistor coupled to the second terminal of the temperature compensation circuitry.

4. The apparatus of claim 1, wherein the process tracker circuitry includes:
a first transistor having a first terminal, a second terminal, and a control terminal, the first terminal of the first transistor coupled to the first terminal of the pass gate circuitry; and
a second transistor having a first terminal, a second terminal, and a control terminal, the first terminal of the second transistor coupled to the second terminal of the first transistor, the control terminal of the first transistor, and the control terminal of the second transistor, the second terminal of the second transistor coupled to the first terminal of the temperature compensation circuitry.

5. The apparatus of claim 4, wherein the first transistor is a p-channel transistor and the second transistor is an n-channel transistor.

6. The apparatus of claim 1, wherein the process tracker circuitry further has a third terminal, the apparatus further comprising a transistor having a first terminal, a second terminal, and a control terminal, the first terminal of the transistor is coupled to a supply terminal, the second terminal of the transistor coupled to the first terminal of the pass gate circuitry and the third terminal of the process tracker circuitry, the control terminal of the transistor coupled to the second terminal of the temperature compensation circuitry.

7. The apparatus of claim 6, wherein the transistor is a first transistor, and the process tracker circuitry includes:
a second transistor having a first terminal, a second terminal, and a control terminal, the first terminal of the second transistor coupled to the second terminal of the pass gate circuitry and the second terminal of the first transistor, the control terminal of the second transistor coupled to the first terminal of the pass gate circuitry; and
a third transistor having a first terminal, a second terminal, and a control terminal, the first terminal of the third transistor coupled to the second terminal of the second transistor, the second terminal of the third transistor coupled to the first terminal of the temperature compensation circuitry and the control terminal of the third transistor.

8. The apparatus of claim 7, wherein the first transistor is a p-channel enhancement mode transistor, the second transistor is an n-channel enhancement mode transistor, and the third transistor is a p-channel enhancement mode transistor.

9. The apparatus of claim 1, wherein the temperature compensation circuitry includes:

a first transistor having a control terminal;

a second transistor having a first terminal and a second terminal, the first terminal of the second transistor coupled to the control terminal of the first transistor; and a third transistor having a first terminal, a second terminal, and a control terminal, the first terminal of the third transistor coupled to the second terminal of the process tracker circuitry, the second terminal of the third transistor coupled to the second terminal of the pass gate circuitry, and the control terminal of the third transistor coupled to the second terminal of the second transistor.

10. The apparatus of claim 9, wherein the first transistor is an n-channel enhancement mode transistor, the second transistor is an n-channel depletion mode transistor, and the third transistor is an n-channel depletion mode transistor.

11. An apparatus comprising:

process tracker circuitry having a terminal; and temperature compensation circuitry including:

a first transistor having a first terminal and a control terminal;

a second transistor having a first terminal, a second terminal, and a control terminal, the first terminal of the second transistor coupled to the first terminal of the first transistor;

a third transistor having a first terminal, a second terminal, and a control terminal, the first terminal of the third transistor is coupled to the control terminal of the first transistor and the second terminal of the second transistor;

a fourth transistor having a first terminal, a second terminal, and a control terminal, the first terminal of the fourth transistor coupled to the control terminal of the third transistor and the control terminal of the third transistor; and a fifth transistor having a first terminal and a control terminal, the first terminal of the fifth transistor coupled to the terminal of the process tracker circuitry, the control terminal of the fifth transistor coupled to the control terminal of the second transistor, the second terminal of the third transistor, and the second terminal of the fourth transistor.

12. The apparatus of claim 11, wherein the terminal of the process tracker circuitry is a first terminal, the process tracker circuitry further has a second terminal, the fifth transistor further has a second terminal, the apparatus further comprising pass gate circuitry having a first terminal and a second terminal, the first terminal of the pass gate circuitry coupled to the second terminal of the process tracker circuitry, the second terminal of the pass gate circuitry coupled to the second terminal of the fifth transistor.

13. The apparatus of claim 11, wherein the terminal of the process tracker circuitry is a first terminal, the process tracker circuitry further has a second terminal and a third terminal, the fifth transistor further has a second terminal, the apparatus further comprising:

a sixth transistor having a first terminal and a control terminal, the control terminal of the sixth transistor coupled to the second terminal of the fifth transistor; and pass gate circuitry having a first terminal and a second terminal, the first terminal of the pass gate circuitry coupled to the second terminal of the process tracker circuitry, the second terminal of the pass gate circuitry coupled to the third terminal of the process tracker circuitry and the first terminal of the sixth transistor.

14. The apparatus of claim 11, wherein the first transistor is an n-channel enhancement mode transistor, the second transistor is an n-channel depletion mode transistor, the third transistor is an N-channel depletion mode transistor, the fourth transistor is an n-channel enhancement mode transistor, and the fifth transistor is an n-channel enhancement mode transistor.

15. The apparatus of claim 11, wherein the fifth transistor further has a second terminal, the apparatus further comprising:

bias current circuitry having a terminal; and current mirror circuitry having a first terminal, a second terminal, and a third terminal, the first terminal of the current mirror circuitry coupled to the terminal of the bias current circuitry, the second terminal of the current mirror circuitry coupled to the control terminal of the third transistor, the first terminal of the fourth transistor, and the control terminal of the fourth transistor, the third terminal of the current mirror circuitry coupled to the second terminal of the fifth transistor.

16. An apparatus comprising:

pass gate circuitry configured to source a first current from a supply;

process tracker circuitry coupled to the pass gate circuitry, the process tracker circuitry configured to:

generate an output voltage responsive to the first current, the output voltage having a negative temperature dependency; and generate a feedback current responsive to generating the output voltage; and temperature compensation circuitry coupled to the process tracker circuitry and the pass gate circuitry, the temperature compensation circuitry configured to:

generate an offset voltage having a positive temperature dependency; and compensate the output voltage with the offset voltage.

17. The apparatus of claim 16, further including:

bias current circuitry configured to generate a bias current; and current mirror circuitry coupled to the pass gate circuitry, the temperature compensation circuitry, and the bias current circuitry, the current mirror circuitry configured to:

mirror the bias current; and supply output currents to the temperature compensation circuitry, wherein the output currents are proportional to the bias current.

18. The apparatus of claim 17, wherein the temperature compensation circuitry includes a plurality of transistors, the bias current having a magnitude that operates the plurality of transistors in a sub-threshold mode of operation, the offset voltage having the positive temperature dependency responsive to the plurality of transistors being in the sub-threshold mode of operation.

19. The apparatus of claim 16, wherein the process tracker circuitry is further configured to generate the output voltage using a plurality of gate-to-source voltages of transistors, the negative temperature dependency responsive to variations in the gate-to-source voltages of the transistors across temperatures.

20. The apparatus of claim 16, wherein the temperature compensation circuitry is further configured to generate the offset voltage using a plurality of gate-to-source voltages of transistors and threshold voltages of the transistors, the positive temperature dependency responsive to variations in the gate-to-source voltages and the threshold voltages across temperatures.

\* \* \* \* \*